United States Patent
Yasuda et al.

(10) Patent No.: US 7,599,039 B2
(45) Date of Patent: Oct. 6, 2009

(54) MOUNTING TERMINAL SUBSTRATE AND DISPLAY DEVICE USING THE SAME

(75) Inventors: Shohei Yasuda, Koushi (JP); Takafumi Hashiguchi, Tokyo (JP); Seiya Ueda, Koushi (JP)

(73) Assignee: Mitsubishi Electric Corporation, Tokyo (JP)

( * ) Notice: Subject to any disclaimer, the term of this patent is extended or adjusted under 35 U.S.C. 154(b) by 255 days.

(21) Appl. No.: 11/780,749

(22) Filed: Jul. 20, 2007

(65) Prior Publication Data

US 2008/0180627 A1    Jul. 31, 2008

(30) Foreign Application Priority Data

Jul. 21, 2006    (JP)    .............................. 2006-198939

(51) Int. Cl.
*G02F 1/1343*    (2006.01)
*G02F 1/1345*    (2006.01)

(52) U.S. Cl. ........................................ 349/152; 349/149

(58) Field of Classification Search ....................... None
See application file for complete search history.

(56) References Cited

U.S. PATENT DOCUMENTS 5,798,812 A    8/1998    Nishiki et al.

7,518,690 B2 *    4/2009    Komaju ........................ 349/151
7,535,522 B2 *    5/2009    Watanabe et al. ............. 349/54

FOREIGN PATENT DOCUMENTS

| JP | 9-90397 | 4/1997 |
|---|---|---|
| JP | 2002-196703 | 7/2002 |

OTHER PUBLICATIONS

U.S. Appl. No. 12/170,783, filed Jul. 10, 2008, Hashiguchi.

* cited by examiner

*Primary Examiner*—Omar Rojas
(74) *Attorney, Agent, or Firm*—Oblon, Spivak, McClelland, Maier & Neustadt, L.L.P.

(57) ABSTRACT

A mounting terminal substrate includes a substrate, mounting terminals arranged in staggered rows on the substrate, each mounting terminals includes a lower conductive film and an upper conductive film, lines that are provided between the mounting terminals in a direction of a row, an insulation film that covers the lines, and opening sections on the respective mounting terminals from which the insulation films are removed, wherein a width of the upper conductive film in the direction of the row is greater than a width of the lower conductive film in the direction of the row so as to cover the lower conductive films exposed through the opening sections and is equal to or smaller than a width of the opening section in the direction of the row.

11 Claims, 6 Drawing Sheets

MOUNTING TERMINAL SUBSTRATE AND DISPLAY DEVICE USING THE SAME

This application claims priority from Japanese Patent Application No. 2006-198939 filed on Jul. 21, 2006, the entire subject matter of which is incorporated herein by reference.

BACKGROUND OF THE INVENTION

1. Field of the Invention

The present invention relates to a mounting terminal substrate having a mounting terminal provided on a substrate and a display device using the substrate, for example, a mounting terminal substrate which can be appropriately utilized for a liquid-crystal display device.

2. Description of the Related Art

A liquid-crystal display device is thin, light weight, and power-thrifty and used as display devices of many pieces of equipment. A chip-on glass (COG) mounting technique for mounting a driver IC for the purpose of driving liquid-crystal directly on a glass substrate on which are formed mounting terminals is frequently used for middle-size and small-size liquid-crystal display devices. In COG mounting, electrical conduction is often established between the mounting terminals and the driver IC by way of an anisotropic conductive film (ACF). In the ACF, conductive particles produced by coating resin balls with Au or Ni are dispersed into an insulative thermosetting adhesive. Protruding electrodes (hereinafter called "bumps") made from Au, or the like, are formed in the terminal of the driver IC. In COG mounting, opening sections in the mounting terminal, from which an insulation film for protecting wiring or a mounting terminal area has been partially removed, are aligned to the bumps, and the substrate is subjected to thermo-compression bonding, whereby electrical conduction is established by way of the conductive particles (e.g., JP-A-2002-196703). Moreover, TAB mounting is often used for a large-size liquid-crystal display device, wherein a mounting terminal formed in line on a glass substrate is mounted on a tape automated bonding (TAB) corresponding to a wiring film substrate on which is mounted a driver IC byway of an ACF (e.g., JP-A-9-90397).

Recently, in a small-size liquid-crystal display device for use with a portable device, a pixel (dot) pitch becomes smaller to a size of the order of 40 μm to 60 μm in association with an increase in resolution. TAB mounting encounters difficulty at such a narrow pitch. In order to address the tendency toward a narrower pitch among mounting terminals, there has been practiced COG mounting in which mounting terminals are staggered in two rows to make the terminal pitch double a wiring pitch. However, in the case of a staggered arrangement, mounting terminals arranged at a narrow pitch has a terminal pitch of about 35 μm.

In association with narrowing of a pitch in the direction of a row where a plurality of mounting terminals are arranged, the width of an opening section in the insulation film along the direction of the row, the opening section being aligned to a position above the mounting terminals, must also be reduced in order to ensure the width of the mounting terminals in the direction of the row and establish electrical conduction with a driver IC. Consequently, a margin of error in positional alignment between the bumps provided on the driver IC and the opening section located above the mounting terminal has become smaller, and there has arisen a problem of a failure to fit the bumps into the opening section when positional displacement having occurred during COG mounting is great. If the bumps fail to fit into the opening section and rest on an insulation film located around the opening section, the following problem will arise.

In mounting of the driver IC by way of the ACF, an overlap area between the bumps and the mounting terminals is reduced, and hence occurrence of a failure of electrical conduction is increased as a result of a decrease in the number of conductive particles contributing to electrical conduction. Moreover, even when electrical conduction were achieved immediately after mounting, a problem of reliability, such as occurrence of an electrical conduction failure, arises in service if the conductive particles in the opening section remain essentially uncollapsed and if the bumps and the mounting terminals cannot be sufficiently bonded through crimping.

Further, in mounting operation for bringing bumps into direct contact with the mounting terminals without involvement of an ACF in order to establish electrical conduction, a contact section between the bumps and the mounting terminal is limited solely to edges of the mounting terminal on the insulation film located around the opening section. Hence, there arises a problem of conduction resistance, namely, an increase in resistance between the bumps and the mounting terminals induced by a significant reduction in contact area.

SUMMARY OF THE INVENTION

The present invention aims at providing a mounting terminal substrate which enables an increase in the margin of positional alignment error in COG mounting, or the like, when compared with the conventional margin of error despite a reduction in pitch among mounting terminals. Specifically, the present invention provides a mounting terminal structure having an opening section which is greater than that of a related-art mounting terminal substrate. Moreover, the present invention provides a display device using such a mounting terminal substrate.

According to an aspect of the present invention, there is provided a mounting terminal substrate including a substrate, mounting terminals arranged in staggered rows on the substrate, each mounting terminals includes a lower conductive film and an upper conductive film, lines that are provided between the mounting terminals in a direction of a row, an insulation film that covers the lines, and opening sections on the respective mounting terminals from which the insulation films are removed, wherein a width of the upper conductive film in the direction of the row is greater than a width of the lower conductive film in the direction of the row so as to cover the lower conductive films exposed through the opening sections and is equal to or smaller than a width of the opening section in the direction of the row.

According to the aspect of the present invention, the margin of positional alignment error in COG mounting can be made greater, and a mounting terminal substrate exhibiting superior conduction reliability and a display device using the substrate can be obtained.

DETAILED DESCRIPTION OF THE PREFERRED EMBODIMENTS

Figure 1:
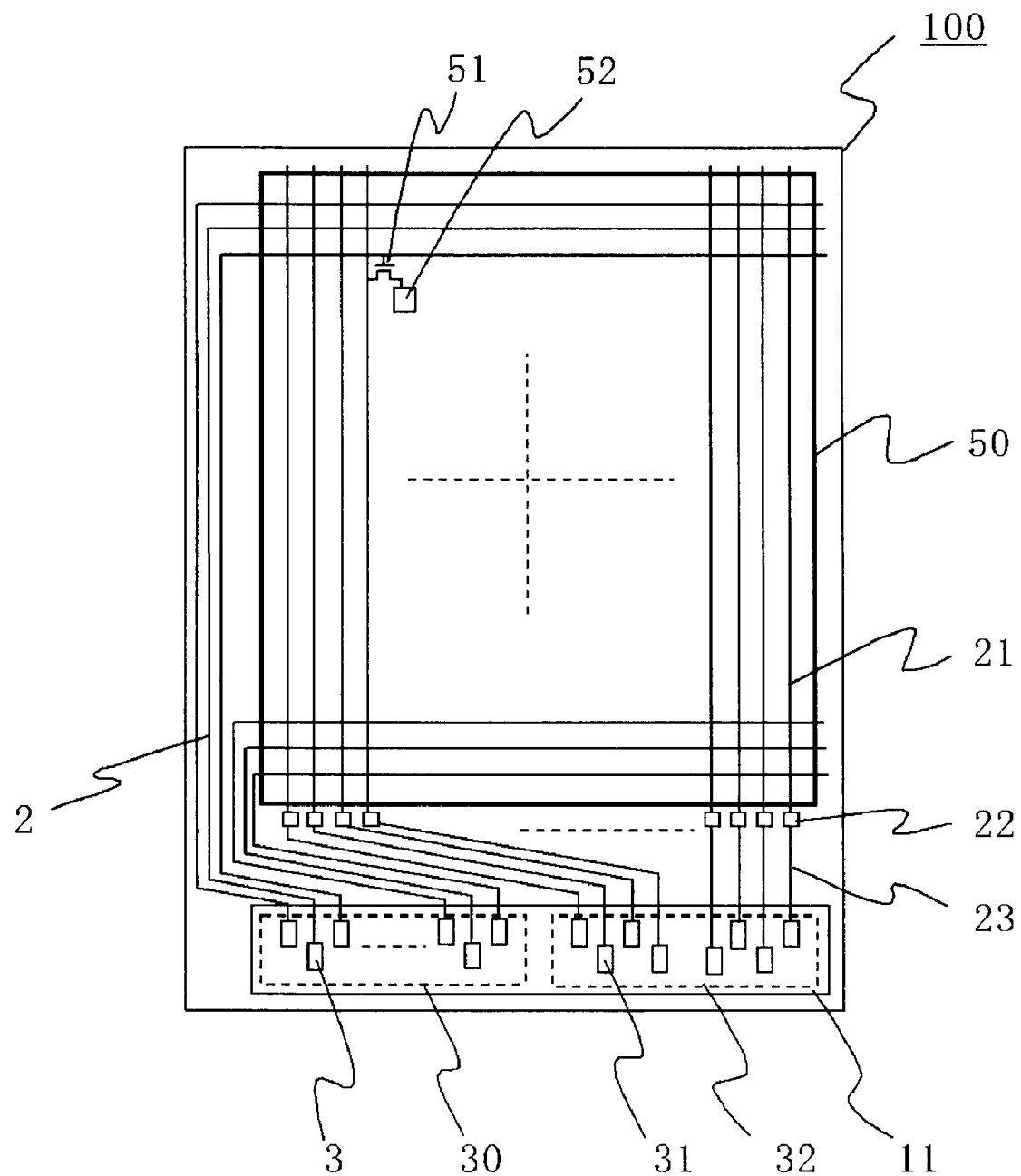
FIG. 1 is a plan view showing a general configuration of a mounting terminal substrate of a liquid-crystal device of a first embodiment of the present invention.

Embodiments of the present invention will be described hereunder by reference to the drawings. In order to describe embodiments provided below, like reference numerals designate like or corresponding elements throughout the drawings. In principle, overlapping explanations are omitted.

First Embodiment

Figure 2:
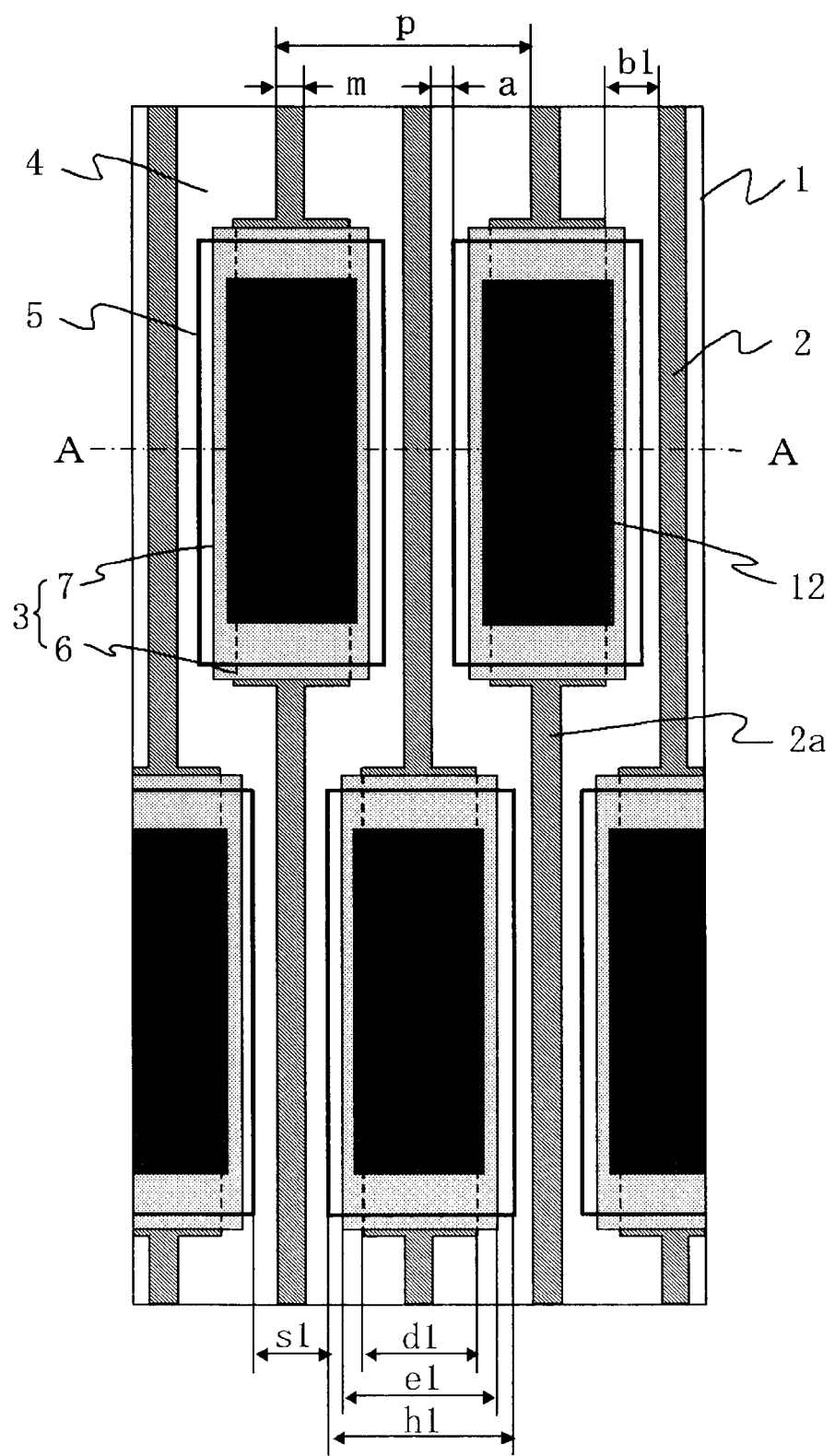
FIG. 2 is a plan view showing a gate mounting terminal area of the first embodiment of the present invention.
Figure 3:
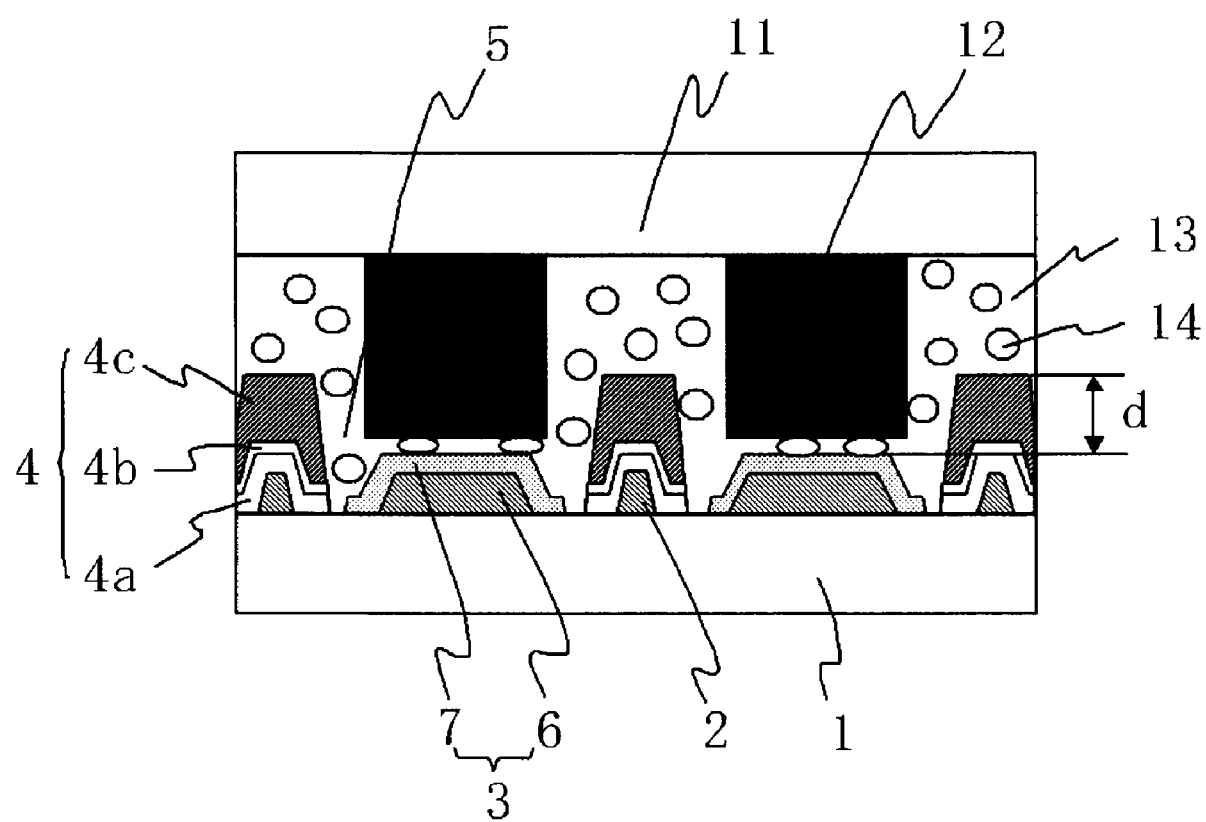
FIG. 3 is a cross-sectional view taken along cutting view A-A shown in FIG. 2.

FIG. 1 is a plan view showing the general configuration of a mounting terminal substrate of a liquid-crystal display device of a first embodiment. FIG. 2 is a plan view showing a gate mounting terminal area of the mounting terminal substrate of the first embodiment. FIG. 3 is a cross-sectional view taken along cutting plane A-A shown in FIG. 2.

In FIG. 1, a pixel area 50 is provided in a mounting terminal substrate 100 which constitutes a portion of the liquid-crystal display device and opposes a color filter substrate by way of a liquid-crystal layer. A plurality of gate lines 2 and source lines 21, which intersect at right angles, are provided in the pixel area 50, and a switching element 51 formed from a thin-film transistor, or the like, and a pixel electrode 52, or the like, are formed in a pixel (only one pixel is illustrated) located at each of the intersections. The plurality of gate lines 2 and the source lines 21 are drawn from the pixel area 50. A gate mounting terminal area 30 formed from a plurality of gate mounting terminals 3 connected to the respective gate lines 2 and a source mounting terminal area 32 formed from a plurality of source mounting terminals 31 connected to the respective source lines 21 are formed along one lower side of the pixel area 50. In the first embodiment, a connection between the source line 21 and the source mounting terminal 31 is converted into a conversion source line 23 formed from the same layer as that of the gate line 2, by means of a conversion section 22 interposed between the source line 21 and the source mounting terminal 31, and the conversion source line 23 is connected to the source mounting terminal 31. Thus, the gate mounting terminal 3 and the source mounting terminal 31 have the same layered structure.

Moreover, the gate lines 2 and the conversion source lines 23 are laid at a narrow wiring pitch of 18 μm in the vicinity of the gate mounting terminal area 30 and the source mounting terminal area 32. In order to address mounting at such a narrow pitch, the gate mounting terminals 3 and the source mounting terminals 31 are staggered in two rows, and a terminal pitch "p" of these terminals is set to 36 μm which is double the wiring pitch of the gate lines 2 and the conversion source lines 23. A driver IC 11, into which a gate driver for driving the gate lines 2 and the source driver for driving the source lines 21 are integrated, is mounted as an external member in the gate mounting terminal area 30 and the source mounting terminal area 32 by way of an ACF through COG mounting.

The gate mounting terminal area 30 is now described in detail by reference to FIGS. 2 and 3. The source mounting terminal area 32 also has the same layered structure as does the gate mounting terminal area 30. As shown in FIGS. 2 and 3, the gate mounting terminals 3 connected to the gate wiring 2 are formed in two staggered rows on the glass substrate 1. Each of the gate mounting terminals 3 is formed from a lower conductive film 6 and an upper conductive film 7 which differ in size from each other. Simultaneously with formation of the gate lines 2, the lower conductive film 6 is formed from a layer identical with the gate lines 2 made from a metallic film of Al, Mo, or the like. Simultaneously with formation of the pixel electrodes 52, the upper conductive film 7 is formed from a layer identical with the pixel electrodes 52 made from a conductive oxide film, such as indium tin oxide (ITO), or the like.

An insulation film 4 covers the gate lines 2 of the gate mounting terminal area 30 and prevents occurrence of a short circuit in or corrosion of the gate lines 2. For connection with the driver IC 11, opening sections 5 from which the insulation film 4 has been removed are provided on the respective gate mounting terminals 3.

In a direction where the plurality of gate mounting terminals 3 are arranged (i.e., a horizontal direction in FIG. 2), the width of the gate mounting terminal 3 in the direction of the row (the width of the gate mounting terminal in the direction of the row is hereinafter described simply as a "width") is smaller than a width h1 of the opening section 5. A width e1 of the upper conductive film 7 is equal to or smaller than the width h1 of the opening section 5. A width d1 of the lower conductive film 6 is made smaller than the width e1 of the upper conductive film 7.

The upper conductive film 7 is formed so as to cover the lower conductive film 6 exposed through the opening sections 5. As a result, the lower conductive film 6 and the upper conductive film 7 are formed from a material which can be selectively etched. The upper conductive film 7 is assumed not to be etched by a solution used for etching the lower conductive film 6. As a result, in subsequent processes, the upper conductive film 7 can be caused to act as a film for protecting the lower conductive film 6 from etching.

For example, reflection pixel electrodes may be formed from Al in the final process among processes for manufacturing a semi-transparent liquid-crystal display device. In a case where the gate lines 2 and the lower conductive film 6 are formed from the same Al as that of the reflection electrodes, when the lower conductive film 6 is exposed through the opening sections 5, there arises a problem of the lower conductive film 6 being also etched during wet-etching of the reflection pixel electrodes. In the present configuration, simultaneously with formation of the transparent pixel electrodes, the upper conductive film 7 is formed from a layer identical with the transparent pixel electrodes made from ITO. So long as Al etchant which does not etch ITO is used at the time of wet-etching of the reflection pixel electrodes, the lower conductive film 6 is not etched, because the lower conductive film 6 is covered with the upper conductive film 7.

When compared with the case where the upper conductive film 7 is formed from a metallic film made from Al, Mo, Cr, or the like, an increase in connection resistance attributable to surface oxidation, corrosion attributable to moisture in the atmosphere or impurities such as chlorine or the like contained in resin such as an ACF 13 or the like, and like phenomena, are reduced to a smaller extent as a result of the upper conductive film 7 being formed from an oxide conductive film such as ITO, or the like. Hence, the reliability of COG mounting can be enhanced.

The insulation film 4 has a three-layer structure consisting of: a gate insulation film 4a formed from a nitride film or an oxide film; a protective film 4b formed on a switching element 51 and from a nitride film or an oxide film; and a thick organic resin film 4c provided for increasing the aperture ratio of a pixel, making the insulation film flat, and reducing parasitic capacitance. Because of the thick organic resin film 4c, the depth "d" of the opening section 5 ranges from 2 μm to 6 μm. Here, the insulation film 4 does not necessarily include the organic resin film 4c.

The height of each of the bumps 12 generally ranges from 15 μm to 20 μm and is greater than the depth "d" of the opening section 5. Hence, so long as the bump 12 can fit into a corresponding opening section 5, the bump 12 can contact the upper conductive film 7.

However, even in the first embodiment, there still exists a possibility of occurrence of the following problems when a great error of positional alignment has arisen in the direction of the row during COG mounting, the bumps 12 have failed to fit into the corresponding opening sections 5, and the bumps 12 rest on the insulation film 4 in the direction of the row.

In COG mounting of the driver IC by way of the ACF 13, when the depth "d" of the opening section 5 is equal to or greater than a diameter of about 3 μm to 4 μm which is a particle size of conductive particles 14 in the ACF 13, the conductive particles 14 remain essentially nondeformed, sufficient crimping between the gate mounting terminals 3 and the bumps 12 cannot be achieved, and hence a conduction failure arises. Alternatively, even when electrical conduction is achieved, a problem of reliability arises. For instance, a problem arises when the depth "d" of the opening section 5 is 3 μm or more and the bumps 12 rest on the insulation film 4 in the direction of the row.

In COG mounting in which electrical conduction is established by means of bringing the bumps 12 into direct contact with the gate mounting terminals 3 without involvement of the ACF 13, the upper conductive film 7 is not provided on the insulation film 4 in the direction of the row. Accordingly, electrical conduction cannot be achieved. For example, even in the case of the depth "d" of the opening section 5 being of the order of 0.5 μm, a problem arises when the bumps 12 rest on the insulation film 4.

Consequently, in the first embodiment, in order to increase a margin of error in positional alignment of the gate mounting terminals with the bumps 12 in the direction of the row, the width h1 of the opening section 5 is designed as largely as possible. However, when the entire insulation film 4 located in the gate mounting terminal area 30 is removed, the gate lines 2 laid between the gate mounting terminals 3 become exposed in the configuration of the staggered arrangement. Hence, there is a risk of occurrence of a short circuit in or corrosion of the gate lines 2. Under the constraints that the gate lines 2 are reliably covered with the insulation film 4, the width h1 of the opening section 5 must be maximized.

Accordingly, in consideration of a positional alignment error of the opening sections 5 and an etching error of the insulation film 4, the opening sections 5 are spaced from the gate lines 2 by an interval "a" so as to reliably cover the gate lines 2 with the insulation film 4. Here, since the interval "a" is 3 μm and the width "m" of the gate line 2 is 4 μm, an interval s1 between the opening sections 5 assumes a value of 10 μm. Since the terminal pitch "p" of the gate mounting terminals 3 is 36 μm, the width h1 of the opening section 5 assumes a value of 26 μm.

The pitch of the bump 12 also assumes a value of 36 μm, and the width of the bump 12 assumes a value of 18 μm. The width h1 of the opening section 5 is 26 μm and greater than the width of the bump 12 by 8 μm. Hence, a value of ±4 μm can be ensured as a margin of positional alignment error arising in the direction of a row during COG mounting.

Occurrence of a short circuit between the gate mounting terminals 3 or between the bumps 12, which would otherwise be caused when the conductive particles 14 dispersed in the ACF 13 are continuously linked together in the direction of a surface of the substrate, can be prevented by means of rendering the gate mounting terminals 3 or the bumps 12 smaller in order to increase the interval. However, the bumps 12 cannot be made much smaller, because of restrictions of a technique for manufacturing bumps and the minimum area required to ensure electrical conduction between the bumps 12 and the gate mounting terminals 3. Meanwhile, the interval between the gate mounting terminals 3 can be set independently of the interval s1 between the opening sections 5. Although the minimum interval, at which a short circuit attributable to the conductive particles 14 does not arise, depends on the diameter and density of the conductive particles 14 in the ACF 13. In other words, the minimum interval is of the order of 12 μm. Consequently, the minimum interval is a value which is equal to or greater than 10 μm of the interval s1 between the opening sections 5, and hence the width e1 of the upper conductive layer 7 becomes equal to or smaller than the width h1 of the opening section 5.

In the first embodiment, the width e1 of the upper conductive film 7 is set to 23 μm. The width d1 of the lower conductive film 6 is set to 17 μm, and edges of the lower conductive film 6 recede inwardly from counterparts of the upper conductive film 7 by 3 μm, and the upper conductive film 7 reliably covers the lower conductive film 6.

Consequently, although the gate lines 2 and the lower conductive film 6 are formed simultaneously from an identical layer, a value of 8 μm is ensured as an interval b1 between the lower conductive film 6 and the gate lines 2. This value is greater than the common minimum interval of 3 μm employed in the manufacturing processes using wet etching for creating a pattern. Therefore, occurrence of a short circuit between the gate lines 2 and the lower conductive film 6 can be substantially prevented.

An extended line 2a extending from the gate mounting terminal 3 is for establishing a connection with a short ring by way of an unillustrated guard resistor or an unillustrated protective diode which is used as countermeasures against static electricity. Alternatively, the extended line 2a is to be connected with a simple terminal for use in testing illumination. Therefore, the extended lines 2a may not be provided. In this case, the extended lines 2a are not provided for the gate mounting terminals 3 belonging to a row of longer gate lines among the two rows of staggered gate lines 2 (a lower row in FIG. 2). Hence, the width h1 of the opening sections 5 of this row can also be designed much greater. However, the margin of error in positional alignment with the single driver IC 11 in the direction of the row arising during COG mounting is limited by the width h1 of the narrower opening section 5 in the row where the gate line 2 exists between the gate mounting terminals 3.

The length of the opening section 5 in the direction of the gate line 2 (i.e., a length in the direction orthogonal to the direction of the row and hereinafter described simply as a "length") is not as narrow as the pitch in the direction of the row. The margin of positional alignment error arising in COG mounting can be designed greatly. Consequently, the lengthwise direction may be the same as that of a related-art structure, and the length of the opening section 5 is made shorter than the length of the lower conductive film 6 of the gate mounting terminal 3, thereby causing edges of the upper conductive film 7 to rest on the insulation film 4. Even in this lengthwise direction, the upper conductive film 7 covers the lower conductive film 6 exposed through the opening section 5.

The length of the opening section 5 is 120 µm, and the length of the bump 12 is 110 µm. Accordingly, the margin of positional alignment error arising in the lengthwise direction during COG mounting assumes a value of ±5 µm. This margin assumes a value which is greater than ±4 µm that is the margin of positional alignment error in the direction of the row.

Figure 4:
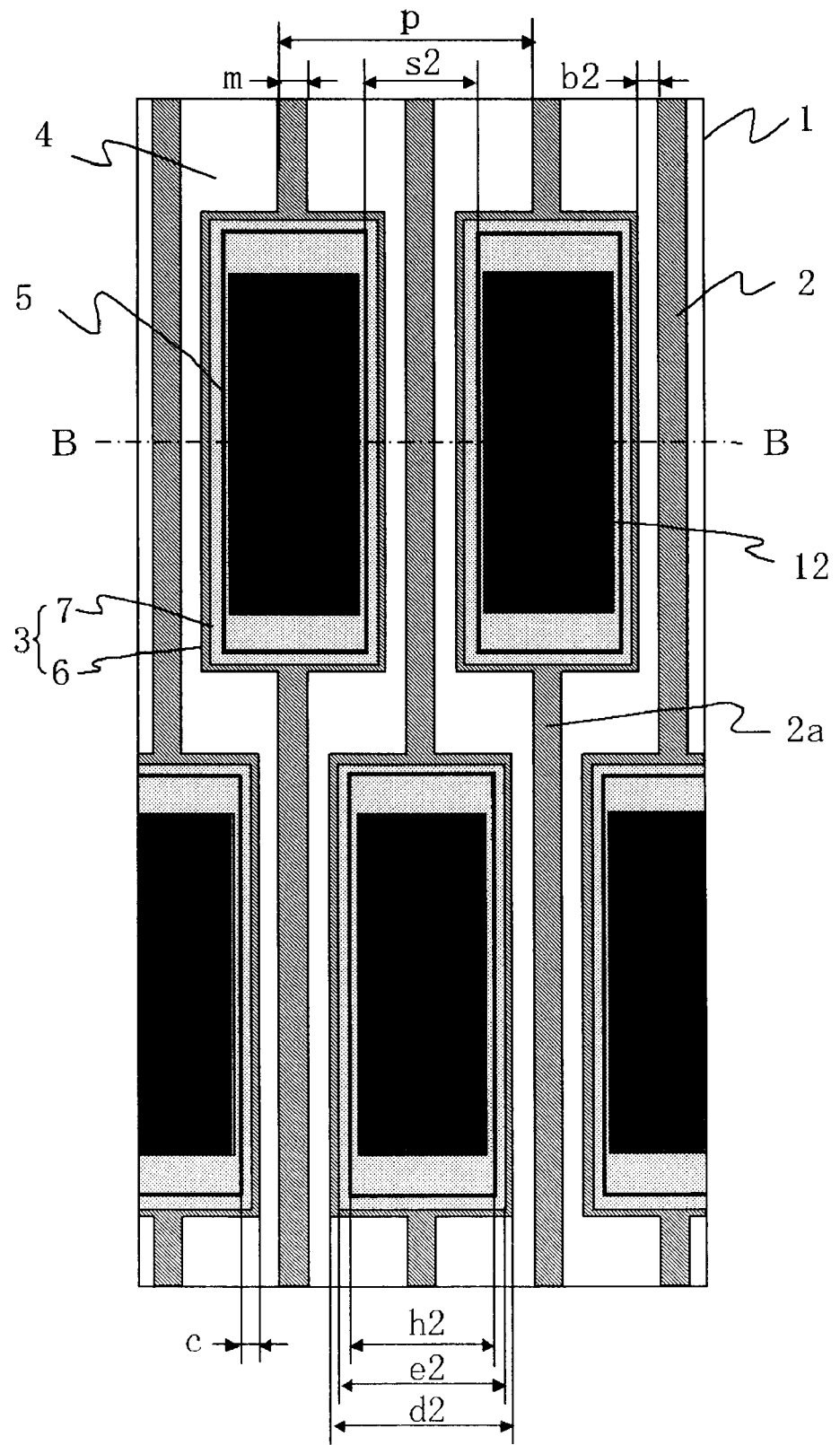
FIG. 4 is a plan view showing a related-art gate mounting terminal area.
Figure 5:
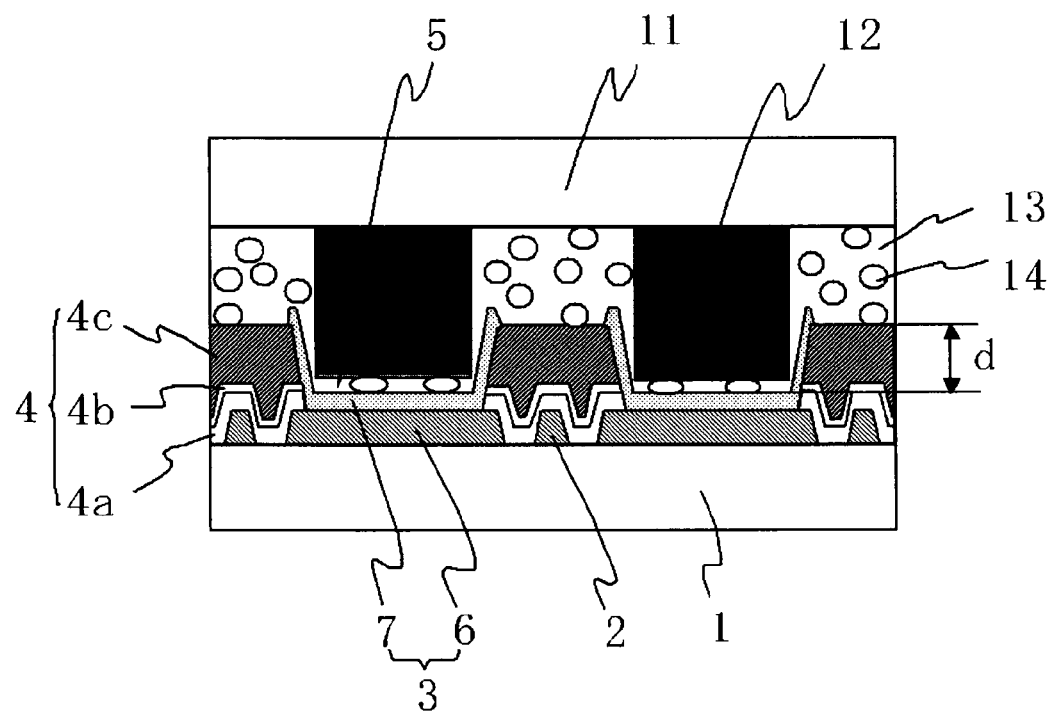
FIG. 5 is a cross-sectional view taken along cutting plane B-B shown in FIG. 4.

Next, when compared with the related-art structure, a description is given to the margin of positional alignment error in COG mounting of the first embodiment being greater than the margin of positional alignment error achieved in the related-art structure. FIG. 4 is a plan view showing a gate mounting terminal area of a related-art mounting terminal substrate. FIG. 5 is a cross-sectional view taken along cutting plane B-B shown in FIG. 4.

A terminal pitch "p" between the gate mounting terminals 3 of the related-art structure assumes the same value of 36 µm as that of the first embodiment. The gate lines 2 and the lower conductive film 6 are formed simultaneously from a metallic film made from Al, Mo, or the like. Since wet etching is used for creating a pattern, the minimum interval b2 between the gate lines 2 and the lower conductive film 6 is 3 µm. Since the width "m" of the gate line 2 is 4 µm, the maximum width d2 of the lower conductive film 6 assumes a value of 26 µm.

Even in the related-art structure, the opening section 5 is formed in the insulation film 4 located above the gate mounting terminal 3. However, the width h2 of the opening section 5 is smaller than the width d2 of the lower conductive film 6. The reason for adoption of such a structure is that, since the material becomes exposed through the opening section 5 is only the lower conductive film 6 and since the glass substrate 1 is not exposed through the opening section 5, unnecessary etching of the glass substrate 1 can be eliminated. In consideration of a positional alignment error and an error of etching of the insulation film 4, edges of the opening section 5 are situated at positions which recede inwardly from the edges of the lower conductive film 6 by an interval "c" of 3 µm.

Consequently, in the related-art structure, the width h2 of the opening section 5 assumes a value of 20 µm, and an interval s2 between the opening sections 5 assumes a value of 16 µm. Since the width of the bump 12 is 18 µm, only a value of ±1 µm can be ensured as the margin of positional alignment error in COG mounting. In contrast, the width h1 of the opening section 5 of the first embodiment is 26 µm, and a value of ±4 µm can be ensured as the margin of positional alignment error in COG mounting, and hence there is yielded an advantage of the ability to ensure a large margin which is greater than the margin ensured in the related-art structure by ±3 µm.

In the related-art structure, the interval b2 between the gate lines 2 and the lower conductive film 6 is set to a minimum value of 3 µm. Accordingly, there is a possibility of occurrence of a short circuit between the gate lines 2 and the lower conductive film 6. Meanwhile, in the first embodiment, since the lower conductive film 6 is formed so as to become smaller than the upper conductive film 7, the interval b1 between the gate lines 2 and the lower conductive film 6 is as large as 8 µm. There is yielded an advantage of the ability to reduce the chance of occurrence of a short circuit between the gate lines 2 and the lower conductive film 6 as compared with the chance of occurrence of a short circuit in the related-art structure.

In COG mounting of the driver IC by way of the ACF 13, the width h2 of the opening section 5 of the related-art structure is also susceptible to a limitation of an interval between the upper conductive films 7. The minimum interval for preventing occurrence of a short circuit between the gate mounting terminals 3, which would otherwise be caused by the conductive particles 14 dispersed in the ACF 13, is of the order of 12 µm, as in the case of the first embodiment. Consequently, since the terminal pitch "p" is 36 µm, a width e2 of the upper conductive film 7 must be made equal to or smaller than 24 µm.

Moreover, the width e2 of the upper conductive film 7 is made greater than the width h2 of the opening section 5 so as to cover the lower conductive film 6 exposed through the opening section 5, and edges of the upper conductive film 7 rest on the insulation film 4. Because of this structure, when consideration is given to a positional alignment error between the opening section 5 and the upper conductive film 7 and an etching error, the edges of the opening section 5 must be situated at positions which recede inwardly from the edges of the upper conductive film 7 by at least 2 µm to 3 µm. The width h2 of the opening section 5 becomes equal to or smaller than 18 µm to 20 µm. In consideration of a limitation of the interval between the upper conductive films 7, the width of the bump 12 is 18 µm, and hence there is no margin of positional alignment error in the direction of a row in COG mounting, or only a value of ±1 µm can be ensured.

As mentioned above, in the related-art structure where the width h2 of the opening section 5 is smaller than the width d2 of the lower conductive film 6, the width h2 of the opening section 5 is susceptible to a limitation of the interval b2 between the gate lines 2 and the lower conductive film 6 in the staggered arrangement and a limitation of the interval between the upper conductive films 7. Meanwhile, in the first embodiment, the width h1 of the opening section is susceptible to only the limitation of the interval "a" at which the gate lines 2 are reliably covered with the respective insulation films 4. Therefore, in light of common manufacturing processes and a common design rule, the width of the opening section 5 is set so as to assume a relationship of h1>h2.

In the first embodiment, a step caused by the insulation film 4 that covers the gate lines 2 exists between the gate mounting terminals 3, and also serves as a barrier to preventing occurrence of a short circuit. Consequently, when the interval between the gate mounting terminals 3 in the present embodiment is compared with a counterpart interval in the related-art structure, the first embodiment yields an advantage of the ability to prevent occurrence of a short circuit between the gate mounting terminals 3 better when compared with the case of the related-art structure.

In the first embodiment, a depth "d" of the opening section 5 in the insulation film 4 is preferably greater than the diameter of the conductive particles 14 in the ACF 13. Further, the depth is preferably smaller than the height of the bump 12. In this case, the conductive particles 14 are rarely connected together between the gate mounting terminals 3 and across the depth "d" of the insulation film 4 continuously in the direction of the surface of the substrate, and occurrence of a short circuit between the gate mounting terminals 3 can be prevented.

In the first embodiment, in the source mounting terminal area 32, the conversion source lines 23 formed from the layer identical with the gate lines 2 are formed intactly as the lower conductive films 6 of the respective source mounting terminals 31. Accordingly, the source mounting terminal area 32 has the same layer structure as that of the gate mounting terminal area 30. By means of such a layer structure, the terminals in the gate mounting terminal area 30 and the terminals in the source mounting terminal area 32 can be made substantially equal to each other in terms of a height. When compared with a case where the gate mounting terminals 3 and the source mounting terminals 31, which are connected to the single driver IC 11, differ from each other in terms of a height, the interval among the bump 12, the gate mounting terminal 3, and the source mounting terminal 31 can be made uniform. Hence, in COG mounting of the driver IC by way of the ACF 13, the conductive particles 14 can be crimped uniformly. Alternatively, in COG mounting in which the bumps 12, the gate mounting terminals 3, and the source mounting terminals 31 are brought into direct contact with each other without involvement of the ACF 13, contact stress can be made uniform. Consequently, there is yielded an advantage of the ability to enhance the reliability of electrical conduction achieved in COG mounting.

Second Embodiment

A second embodiment relates to a configuration of the top layer of the insulation film 4 being the organic resin film 4c and the upper conductive film 7 being ITO. ITO formed on an organic substance differs from ITO formed on an inorganic substance in terms of film quality and an etch rate. An etch rate of the ITO formed on an organic substance is two to eight times as high as an etch rate of the ITO formed on an inorganic substance.

Since the two types of ITO greatly differ from each other in terms of an etch rate, etching of ITO must be divided into two operations in the first embodiment in order to process, with superior dimensional accuracy, the pixel electrodes 52 made from ITO formed on the organic resin film 4c and the upper conductive film 7 made from ITO. After etching of the pixel electrodes 52 whose etch rate is high, the ITO still remaining on the glass substrate 1 within the opening sections 5 is removed by means of additional etching while the pixel electrodes 52 are protected by means of a resist mask.

In contrast, in the second embodiment, the number of operations for etching ITO is reduced to one in order to curtail the number of etching processes, and there is achieved a structure where ITO films 7a remaining on the glass substrate 1 that is an inorganic substance are left in a self-aligned manner and into the shape of the opening section 5.

Figure 6:
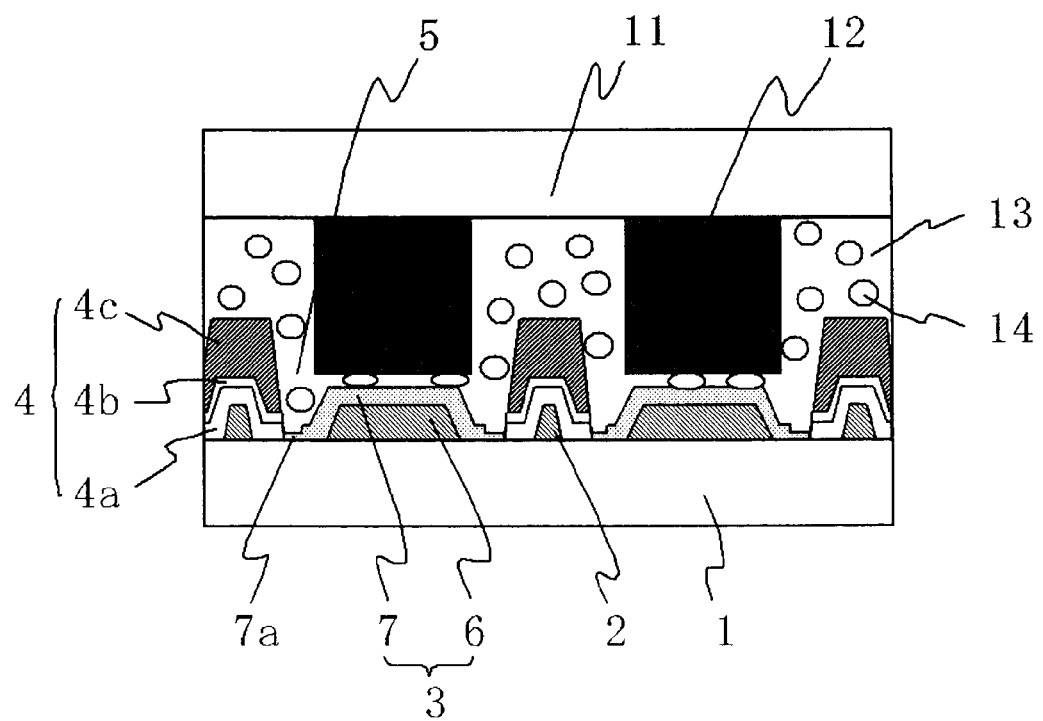
FIG. 6 is a cross-sectional view showing a gate mounting terminal area of a second embodiment of the present invention.

FIG. 6 is a cross-sectional view showing a gate mounting terminal area of the second embodiment. Even at a point in time additional etching has been performed after completion of etching of ITO on the organic resin film 4c, the upper conductive film 7 formed from ITO assumes, in an area where the glass substrate 1 is exposed through the opening sections 5, a shape by means of which the ITO film 7a remains from the position of the resist mask of the upper conductive film 7 to the lower ends of the respective opening sections 5. Since the etch rate of the ITO on the organic resin 4c is high, the ITO is etched reliably. However, since the etch rate of the ITO remaining in the opening sections 5 is low, the upper conductive film 7 including the remaining ITO films 7a is formed in a self-aligned manner in line with the width h1 of the opening section 5. In this case, even when the ITO film 7a still remains, the ITO on the organic resin film 4c existing between the gate mounting terminals 3 can be reliably etched. Hence, an advantage of the ability to prevent occurrence of a short circuit between the gate mounting terminals 3 is yielded even through a smaller number of etching processes.

Since the remaining ITO films 7a prevented exposure of the glass substrate 1 through the opening sections 5, there is yielded an advantage of the ability to prevent unwanted etching of the glass substrate 1 in subsequent processes.

Third Embodiment

Figure 7:
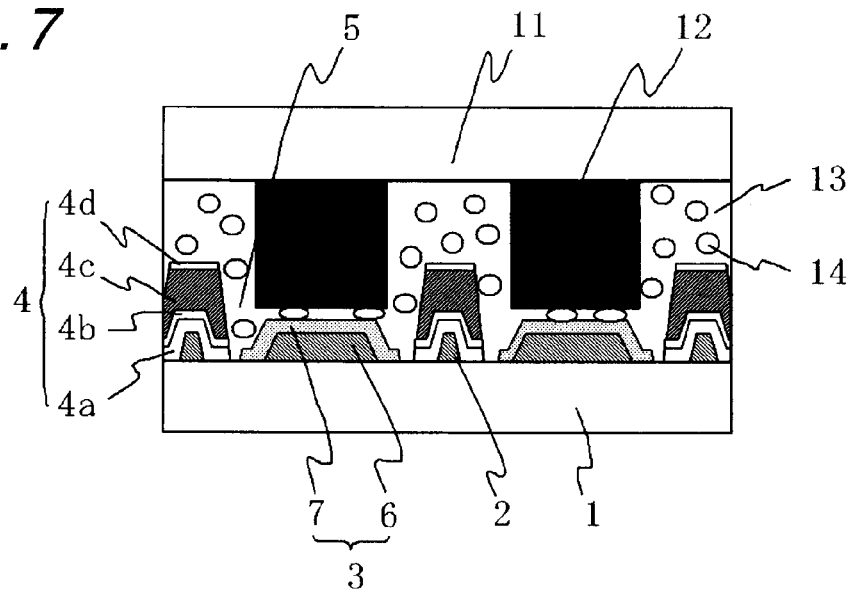
FIG. 7 is a cross-sectional view showing a gate mounting terminal area of a third embodiment of the present invention.

FIG. 7 is a cross-sectional view showing a gate mounting terminal area of a third embodiment. An inorganic insulation film 4d formed from an oxide film or a nitride film is formed additionally on the organic resin film 4c forming the insulation film 4. The top layer of the insulation film 4 is formed as the inorganic insulation film 4d, thereby rendering the etch rate of the pixel electrodes 52 and the etch rate of the upper conductive films 7, which are formed from different types of ITO, uniform and enhancing dimensional accuracy. Since ITO is formed on the inorganic substance by means of such a configuration, the etch rate becomes low. However, an advantage of the ability to form the pixel electrodes 52 and the upper conductive films 7 in their originally-designed positions by means of single etching of ITO without involvement of the remaining ITO films 7a is yielded with superior accuracy.

Incidentally, the organic resin film 4c adjoins respective side surfaces of the opening sections 5. Thus, the etch rate of ITO of the side surfaces is high, and the ITO is removed reliably. An advantage of the ability to prevent occurrence of a short circuit between the gate mounting terminals 3, which would otherwise be caused by the remaining ITO film 7a, through a fewer number of etching processes is yielded.

Fourth Embodiment

Figure 8:
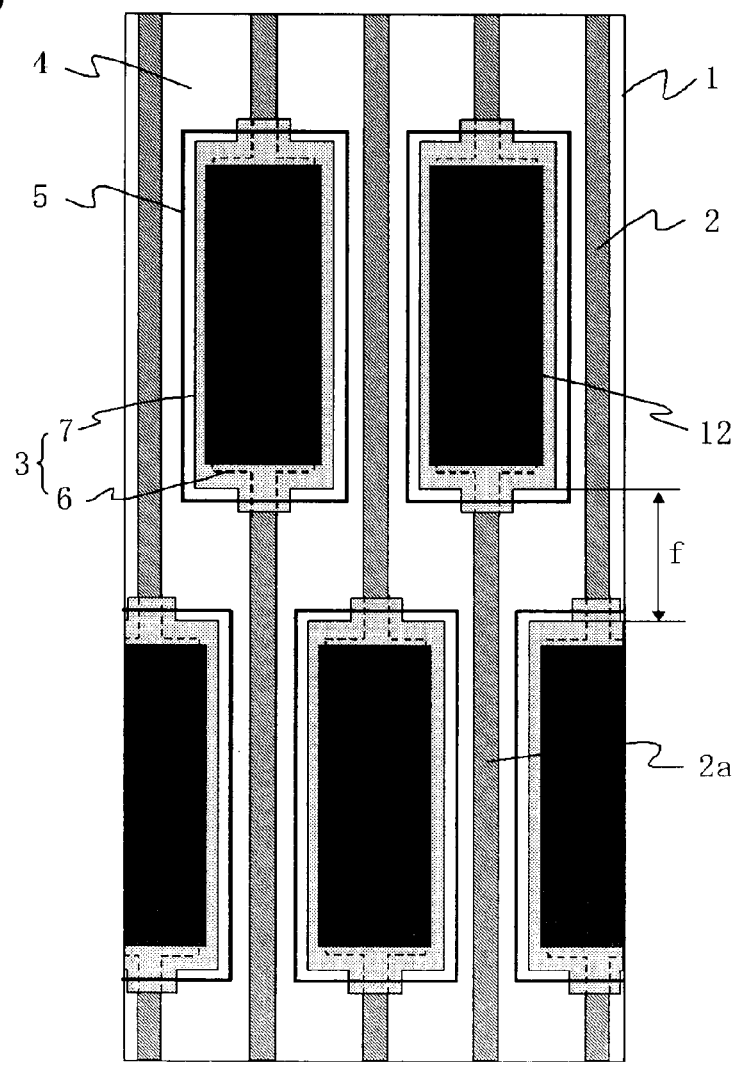
FIG. 8 is a plan view showing a gate mounting terminal area of a fourth embodiment of the present invention.

FIG. 8 is a plan view showing a gate mounting terminal area of a fourth embodiment. As shown in FIG. 2, in the first embodiment, a pitch between the gate mounting terminals 3 in the lengthwise direction thereof is not as small as the pitch between the gate mounting terminals 3 in the direction of the row. Hence, as is the case with the related-art structure, there is adopted a structure of the length of the opening section 5 being made shorter than the length of the lower conductive film 6, to thus cause the edges of the upper conductive film 7 to rest on the insulation film 4. As shown in FIG. 8, in the fourth embodiment, the structure of the gate mounting terminal 3 achieved in the lengthwise direction thereof is made equal to the structure of the gate mounting terminal 3 achieved in the direction of the row in the first embodiment. Incidentally, the gate lines 2 and the extended lines 2a, which are formed from the same layer as that of the lower conductive film 6, are covered with and protected by the upper conductive film 7. Thus, only the area where the gate lines 2 and the extended lines 2a extend from the respective gate mounting terminals 3 is provided with the related-art structure where the edges of the upper conductive film 7 rest on the insulation film 4. As mentioned above, the structure of the gate mounting terminal 3 achieved in the lengthwise direction thereof is made equal to the structure of the same achieved in the direction of the row, whereby an advantage of the ability to increase a lengthwise interval "f" between the upper conductive films 7 of the staggered rows by means of the opening sections 5 of the same size and layout as those achieved in the first embodiment is obtained. Alternatively, when the interval "f" is unchanged, the length of the opening section 5 can be increased as compared with that achieved in the first embodiment.

Although the above embodiments have mentioned COG mounting, the present invention can be applied to mounting of an external member, such as a wiring board having bumps, a wired film substrate, or the like, on a glass substrate as well as to mounting of a driver IC on a glass substrate. Moreover, the mounting terminal board having a mounting terminal structure of the present invention can also be applied to a common semiconductor substrate or an electronic circuit board.

Furthermore, the liquid-crystal display device has been described thus far, the mounting terminal substrate can also be applied to a display device, such as an electroluminescence (EL) display device, an electrochromic display device, electronic paper using fine particles, oil, or the like, and other devices.

What is claimed is:

1. A mounting terminal substrate comprising:
    a substrate;
    mounting terminals arranged in staggered rows on the substrate, each mounting terminals comprising:
        a lower conductive film; and
        an upper conductive film;
    lines that are provided between the mounting terminals in a direction of a row;
    an insulation film that covers the lines; and
    opening sections on the respective mounting terminals from which the insulation films are removed,
    wherein a width of the upper conductive film in the direction of the row is greater than a width of the lower conductive film in the direction of the row so as to cover the lower conductive films exposed through the opening sections and is equal to or smaller than a width of the opening section in the direction of the row.

2. The mounting terminal substrate according to claim 1, wherein the lines and the lower conductive films are formed from a single layer.

3. The mounting terminal substrate according to claim 1, wherein the insulation film includes an organic resin film.

4. The mounting terminal substrate according to claim 3, wherein an inorganic insulation film is formed on the organic resin film.

5. The mounting terminal substrate according to claim 1, wherein the lower conductive film and the upper conductive film are subjected to selective etching.

6. The mounting terminal substrate according to claim 1, wherein the upper conductive film comprises a conductive oxide film.

7. The mounting terminal substrate according to claim 1, wherein the width of the upper conductive film in the direction of the row is formed in a self-aligned manner and in conformance with the width of the opening section in the direction of the row.

8. The mounting terminal substrate according to claim 1, wherein the mounting terminals on the substrate are of the same layer structure in order to assume substantially the same height.

9. The mounting terminal substrate according to claim 1, further comprising:
    an external member having protruding electrodes smaller than the opening sections,
    wherein the mounting terminals and the protruding electrodes are connected together within respective opening sections.

10. The mounting terminal substrate according to claim 9, further comprising:
    anisotropic conductive film that connects the mounting terminals to the protruding electrodes,
    wherein a depth of each of the opening sections to a surface of a corresponding mounting terminal is greater than a diameter of conductive particles dispersed in the anisotropic conductive film and is smaller than a height of the protruding electrodes.

11. A display device using a mounting terminal substrate, the mounting terminal substrate comprising:
    a substrate;
    mounting terminals arranged in staggered rows on the substrate, each mounting terminals comprising:
        a lower conductive film; and
        an upper conductive film;
    lines that are provided between the mounting terminals in a direction of a row;
    an insulation film that covers the lines; and
    opening sections on the respective mounting terminals from which the insulation films are removed,
    wherein a width of the upper conductive film in the direction of the row is greater than a width of the lower conductive film in the direction of the row so as to cover the lower conductive films exposed through the opening sections and is equal to or smaller than a width of the opening section in the direction of the row.

* * * * *